US010636620B2

United States Patent
Kobayashi et al.

(10) Patent No.: US 10,636,620 B2
(45) Date of Patent: Apr. 28, 2020

(54) CHARGED PARTICLE BEAM DEVICE AND CONTROL METHOD OF CHARGED PARTICLE BEAM DEVICE

(71) Applicant: HITACHI HIGH-TECHNOLOGIES CORPORATION, Tokyo (JP)

(72) Inventors: Hiroshi Kobayashi, Tokyo (JP); Akira Karakama, Tokyo (JP); Norio Sato, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/580,231

(22) PCT Filed: Jun. 11, 2015

(86) PCT No.: PCT/JP2015/066875
§ 371 (c)(1),
(2) Date: Dec. 6, 2017

(87) PCT Pub. No.: WO2016/199271
PCT Pub. Date: Dec. 15, 2016

(65) Prior Publication Data
US 2018/0151328 A1 May 31, 2018

(51) Int. Cl.
*H01J 37/22* (2006.01)
*H01J 37/24* (2006.01)
(Continued)

(52) U.S. Cl.
CPC .............. *H01J 37/22* (2013.01); *H01J 37/20* (2013.01); *H01J 37/244* (2013.01); *H01J 37/28* (2013.01);
(Continued)

(58) Field of Classification Search
CPC .......... H01J 37/24; H01J 37/244; H01J 37/22; H01J 37/20; H01J 37/28
See application file for complete search history.

(56) References Cited

U.S. PATENT DOCUMENTS 6,748,124 B1 * 6/2004 Nishiyama ............ G06T 7/0004
382/149

FOREIGN PATENT DOCUMENTS

JP 2003-203594 A 7/2003
JP 2004-171936 A 6/2004
(Continued)

OTHER PUBLICATIONS

International Search Report dated Aug. 4, 2015 of International Application No. PCT/JP2015/066875.
(Continued)

*Primary Examiner* — Eliza W Osenbaugh-Stewart
(74) *Attorney, Agent, or Firm* — Volpe and Koenig, P.C.

(57) ABSTRACT

By switching between a plurality of image transfer units based on a state of a stage and using the switched image transfer unit, traceability of stage movement and tolerance to communication failure can be improved. A first image transfer protocol is a protocol of which reliability is higher than reliability of a second image transfer protocol, and a switch unit may select a first image transfer unit in a case where it is determined that a state of a stage is a state in which the stage is stopping. A second image transfer unit is a protocol of which a transfer speed is higher than a transfer speed of the first image transfer protocol, and the switch unit may select the second image transfer unit in a case where it is determined that the state of the stage is a state in which the stage is moving.

12 Claims, 12 Drawing Sheets

(51) Int. Cl.
*H01J 37/20* (2006.01)
*H01J 37/244* (2006.01)
*H01J 37/28* (2006.01)

(52) U.S. Cl.
CPC . *H01J 2237/063* (2013.01); *H01J 2237/2025* (2013.01); *H01J 2237/20228* (2013.01); *H01J 2237/221* (2013.01); *H01J 2237/24507* (2013.01); *H01J 2237/30416* (2013.01)

(56) References Cited

FOREIGN PATENT DOCUMENTS

| | | |
|---|---|---|
| JP | 2011-065888 A | 3/2011 |
| JP | 2014-137974 A | 7/2014 |
| WO | 2014/112205 A1 | 7/2014 |

OTHER PUBLICATIONS

Chinese Office Action dated Sep. 27, 2018 for the Chinese Patent Application No. 201580080270.0.

* cited by examiner

[Fig. 1]
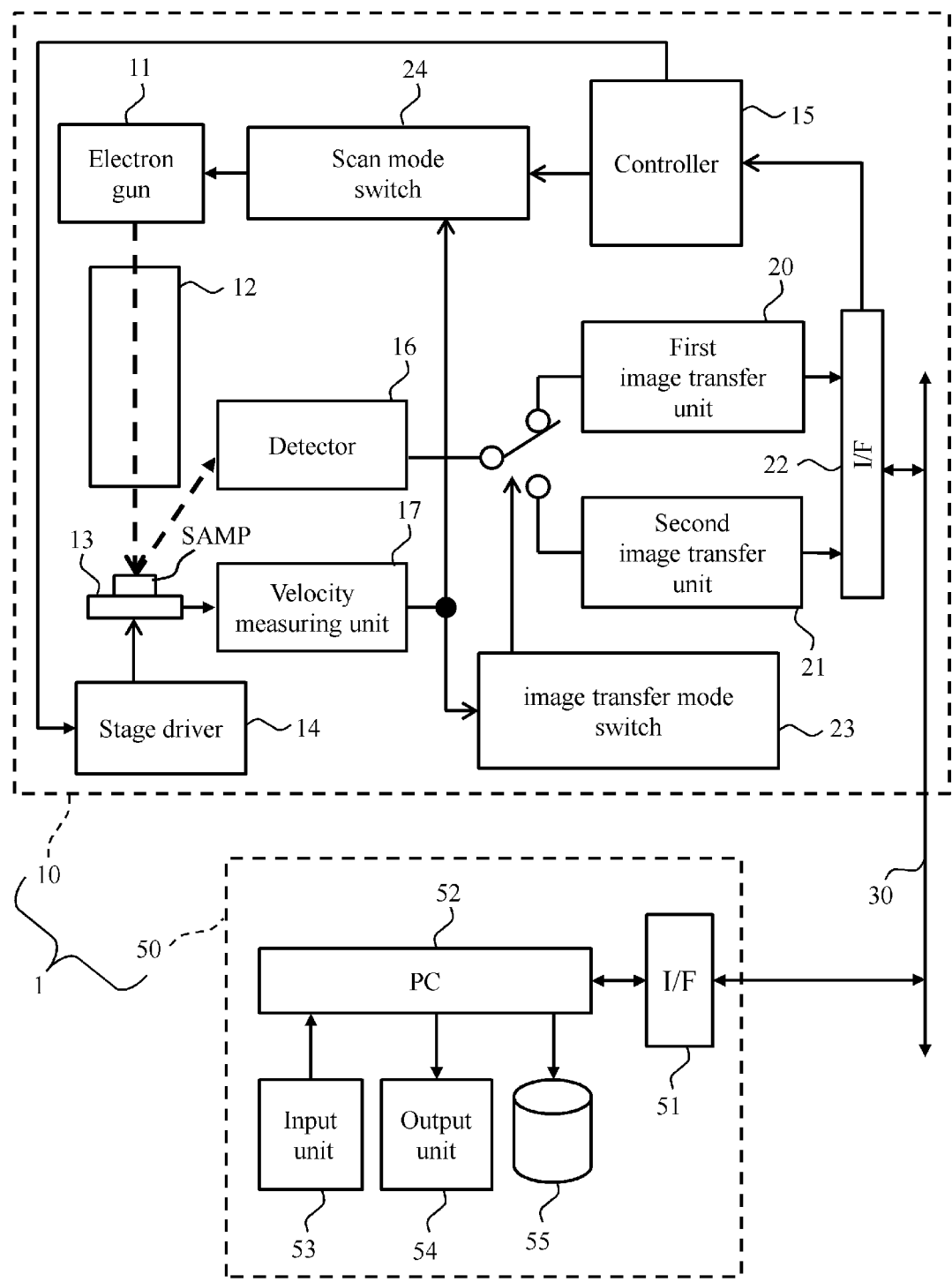

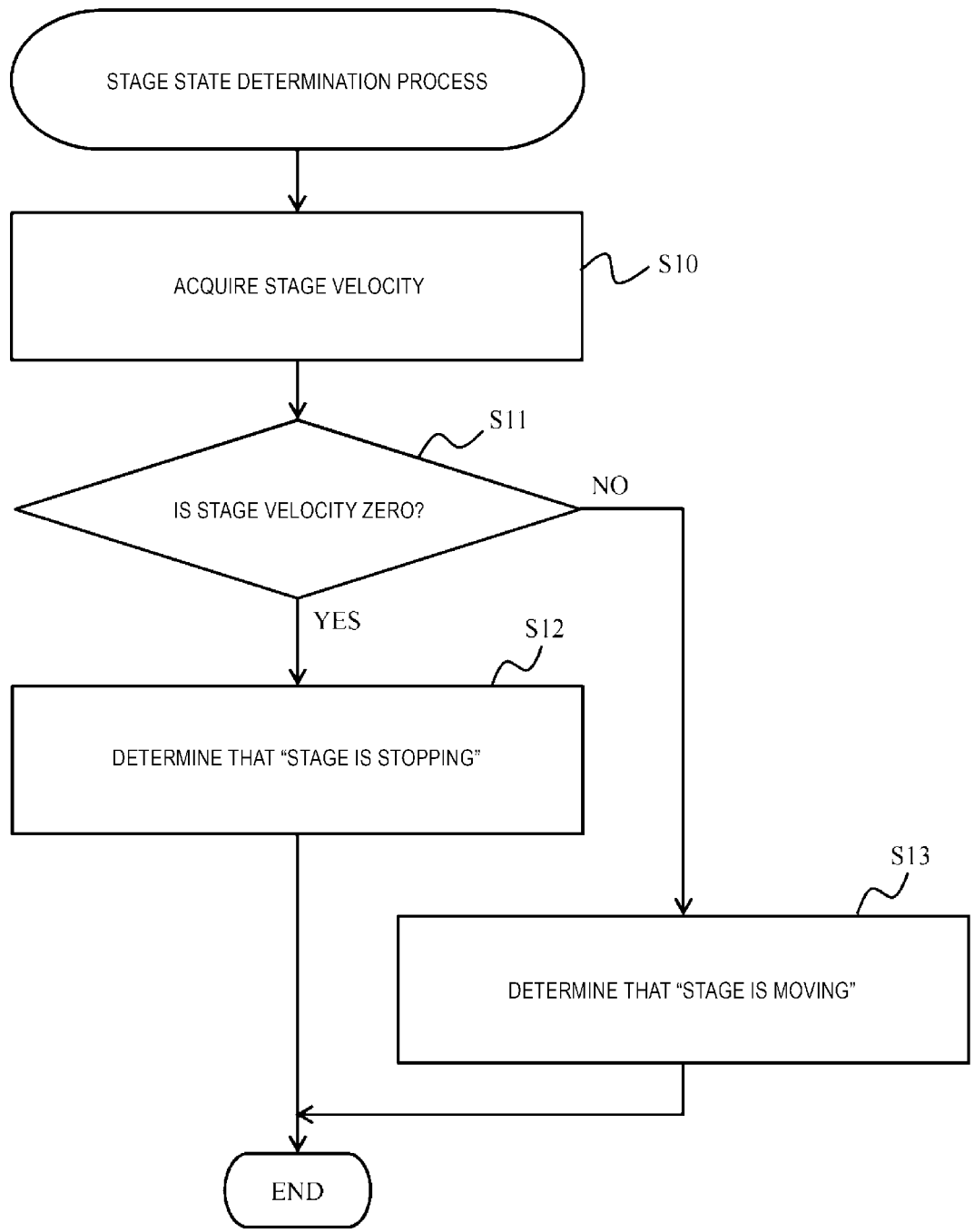
[Fig. 2]

[Fig. 3]
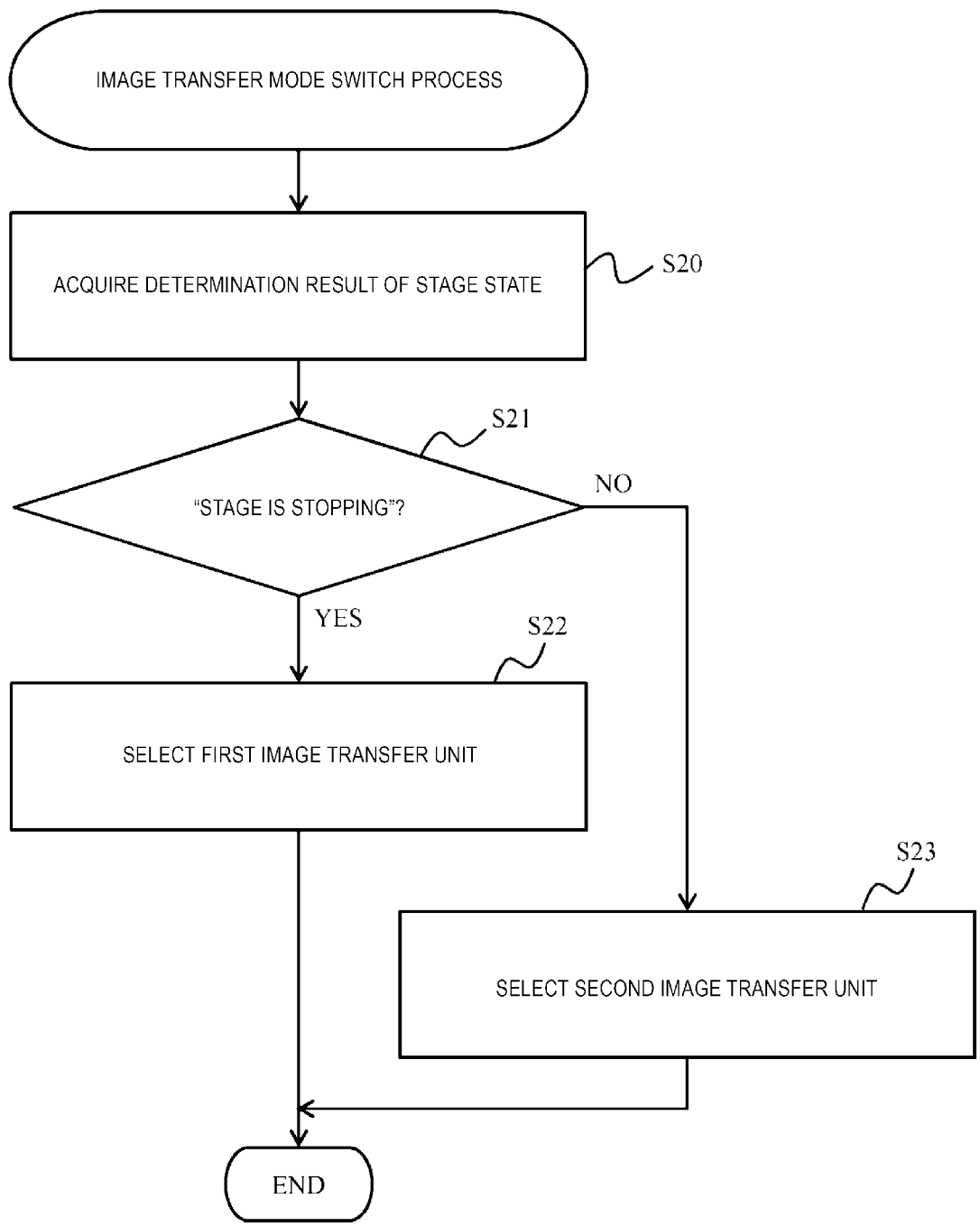

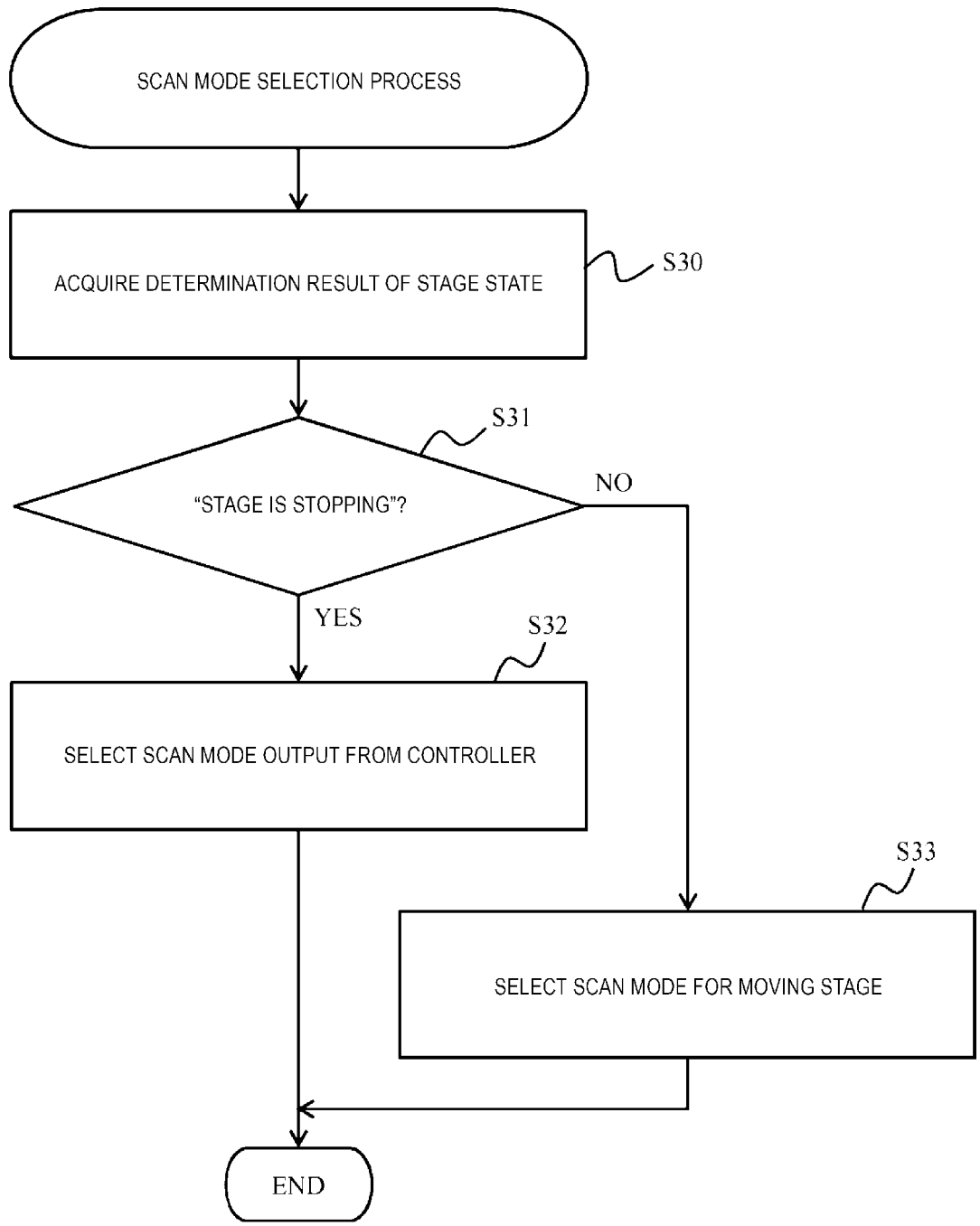
[Fig. 4]

[Fig. 5]
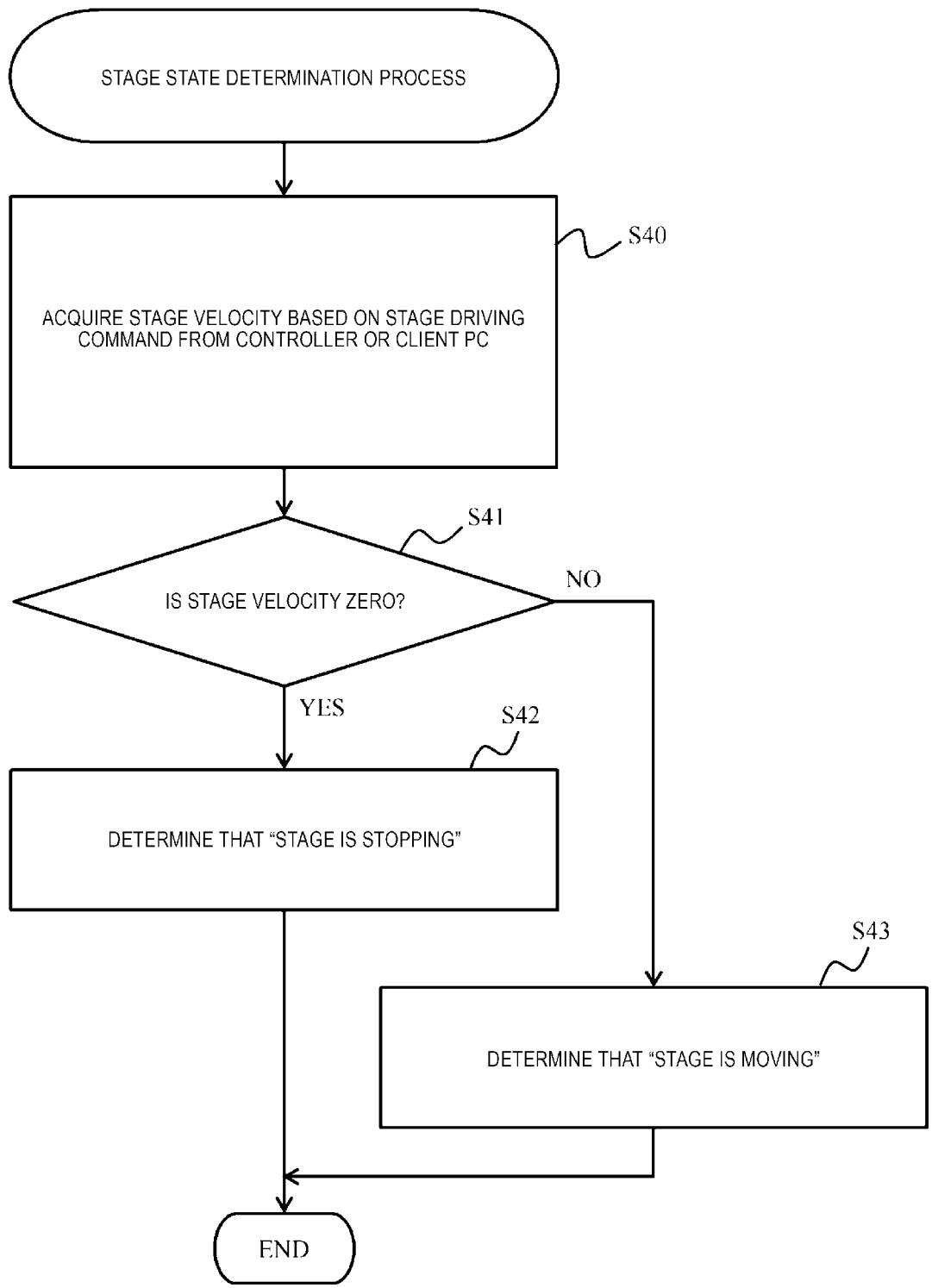

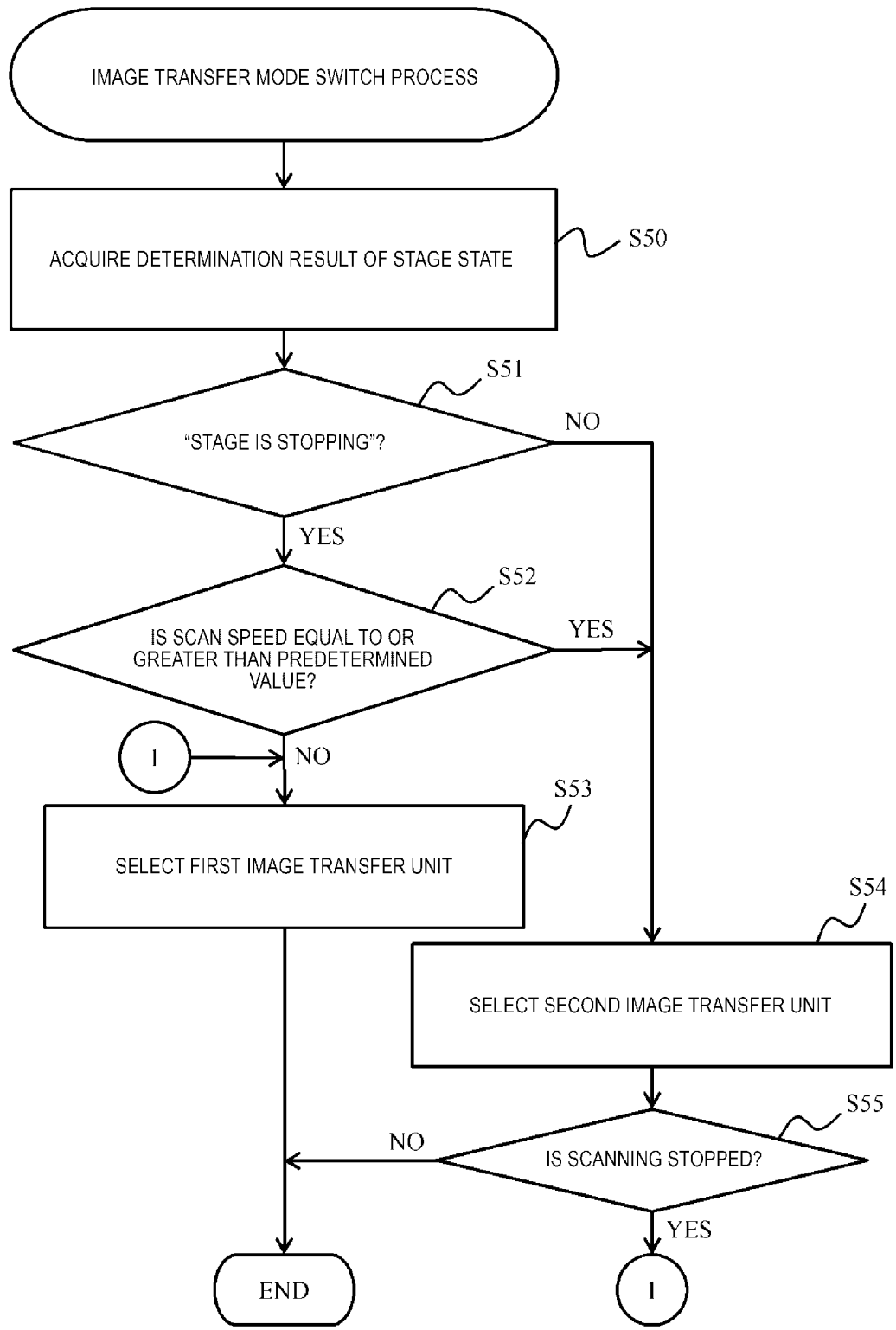
[Fig. 6]

[Fig. 7]
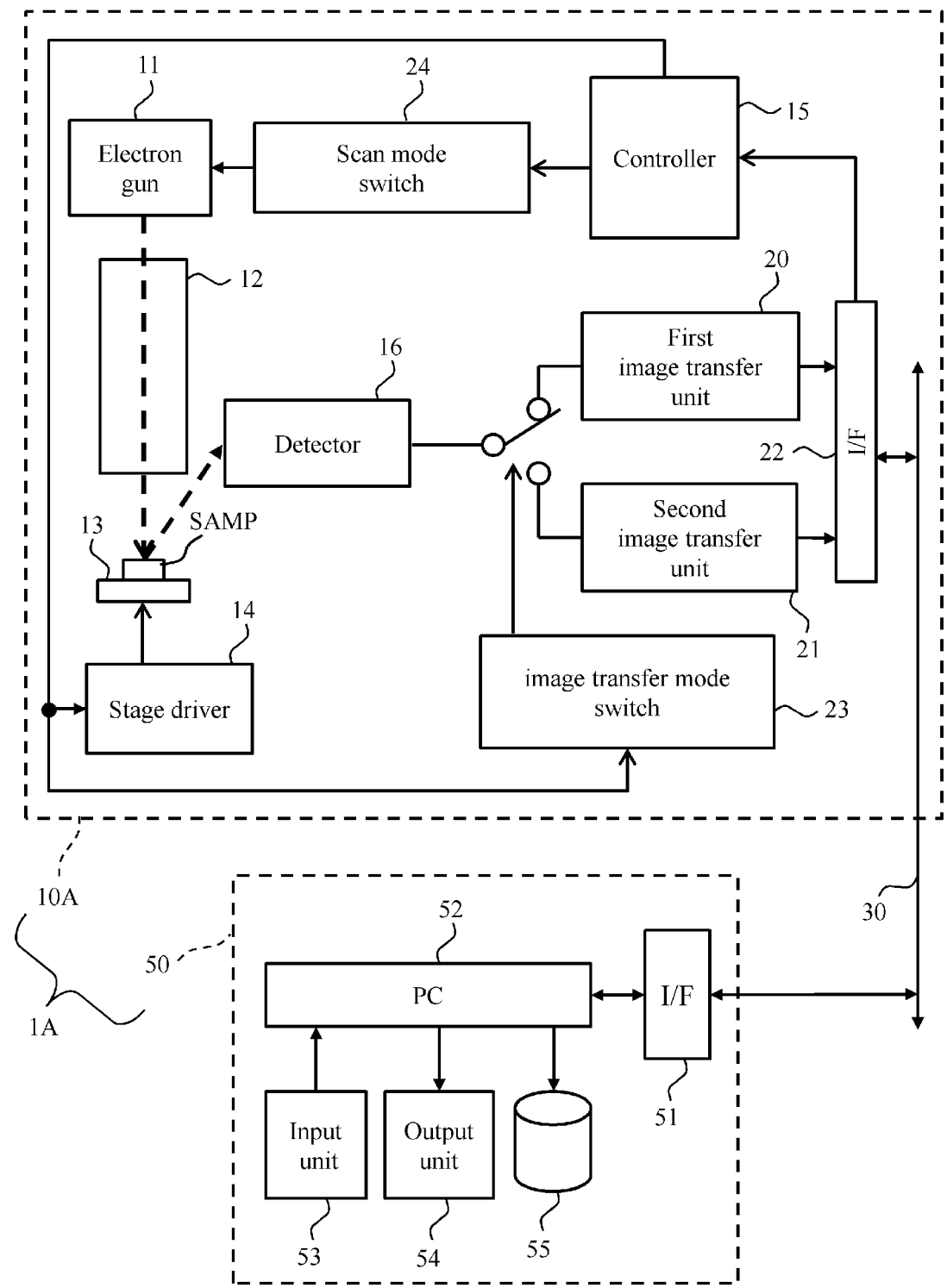

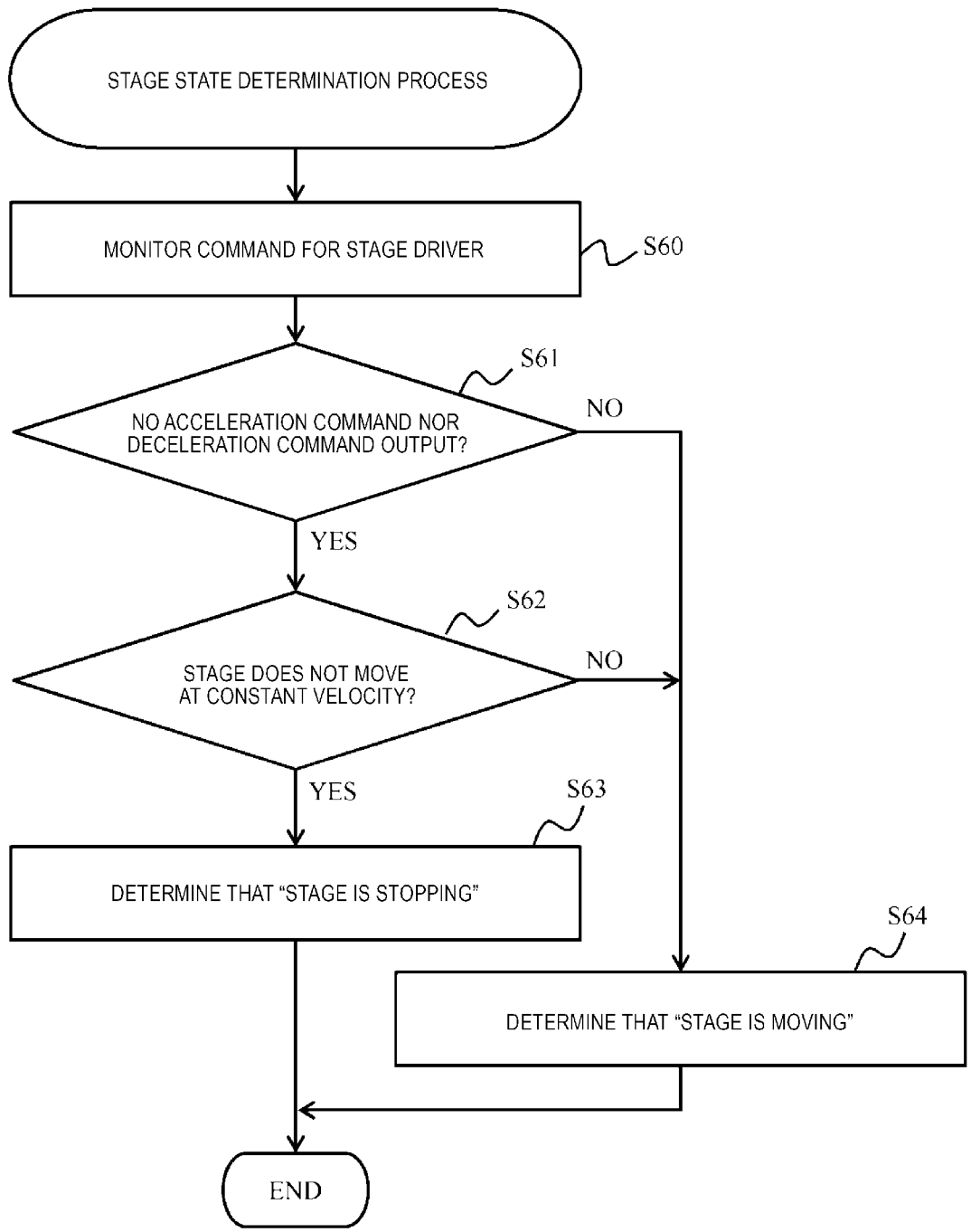
[Fig. 8]

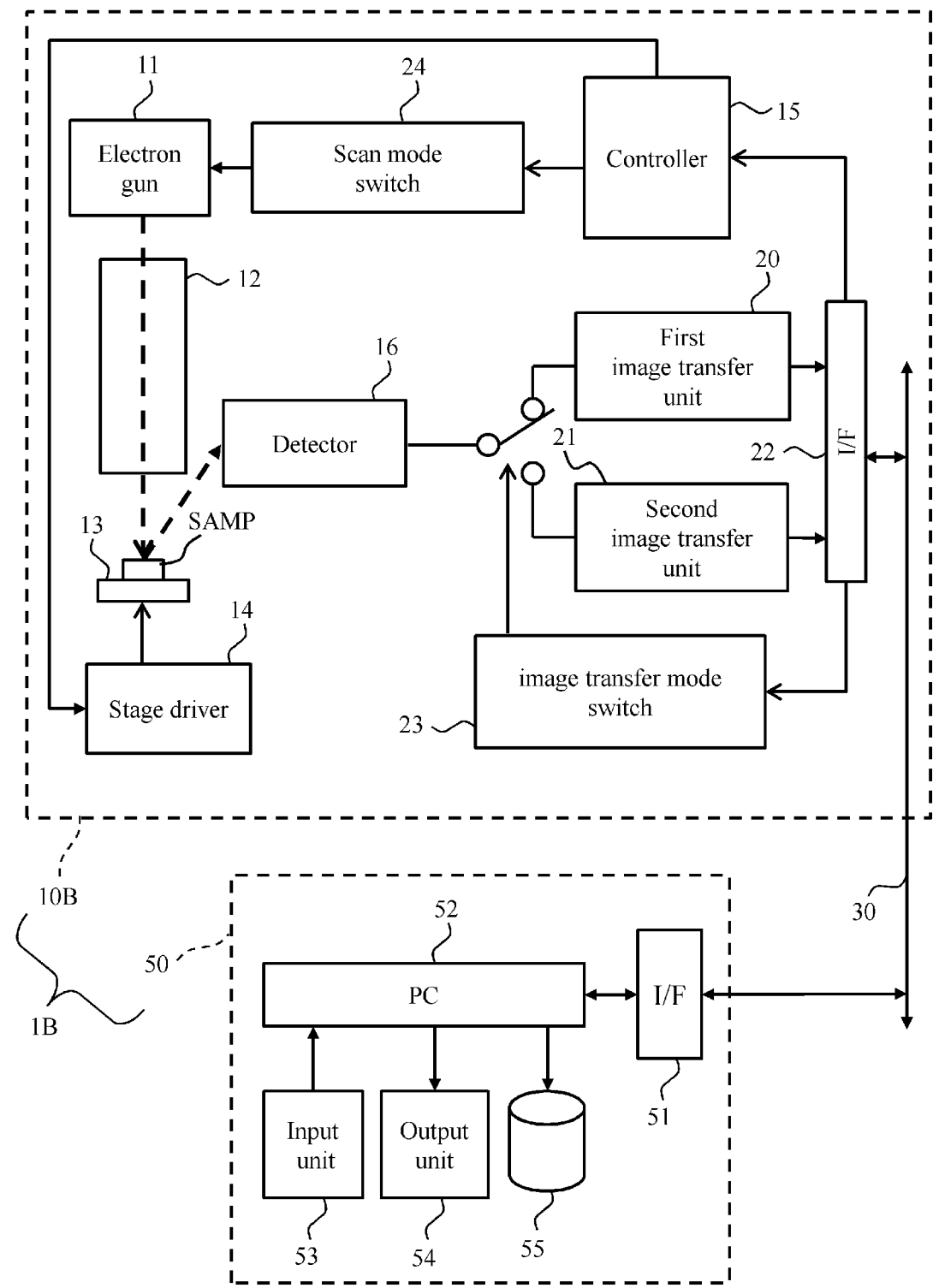
[Fig. 9]

[Fig. 10]
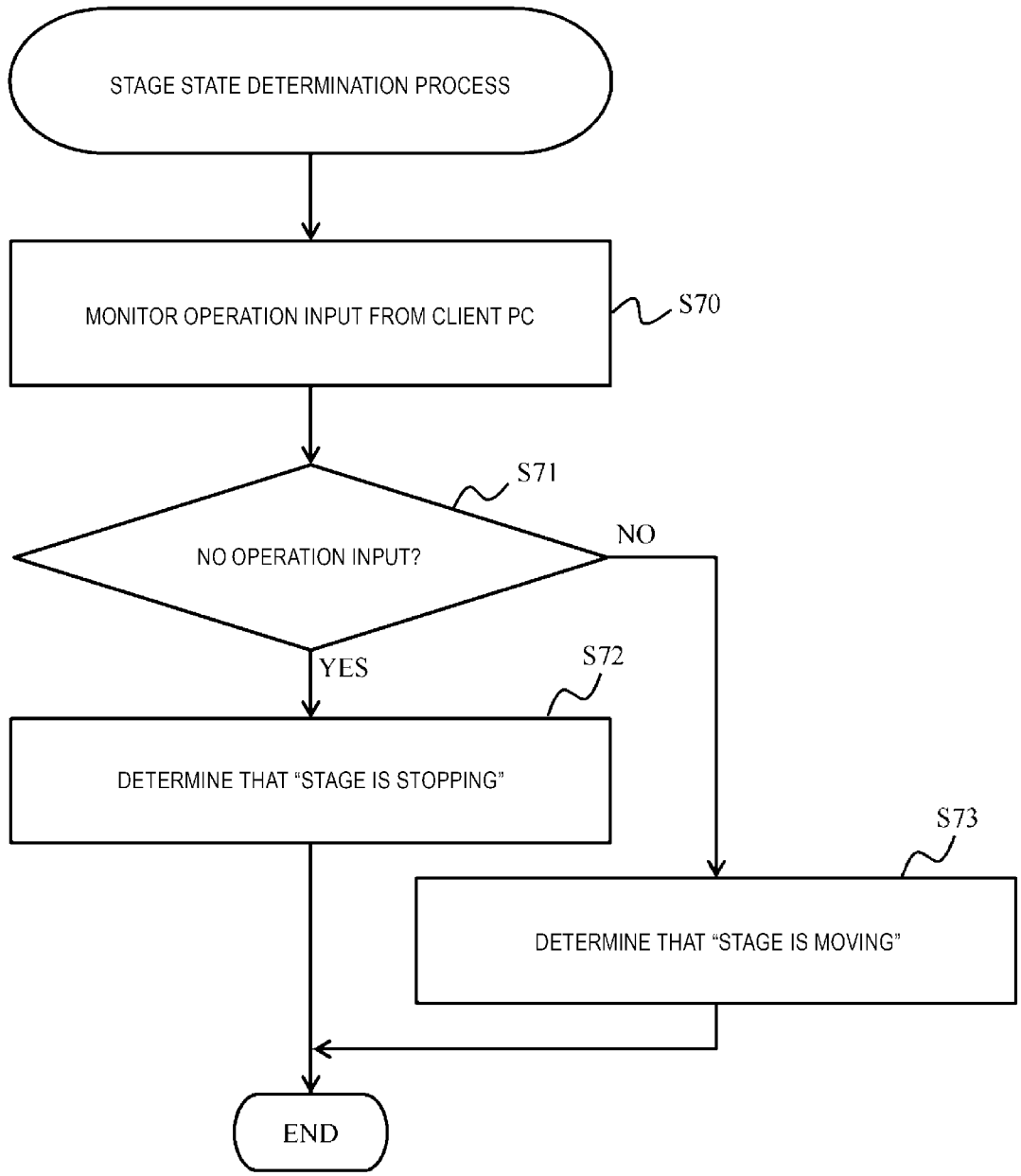

[Fig. 11]
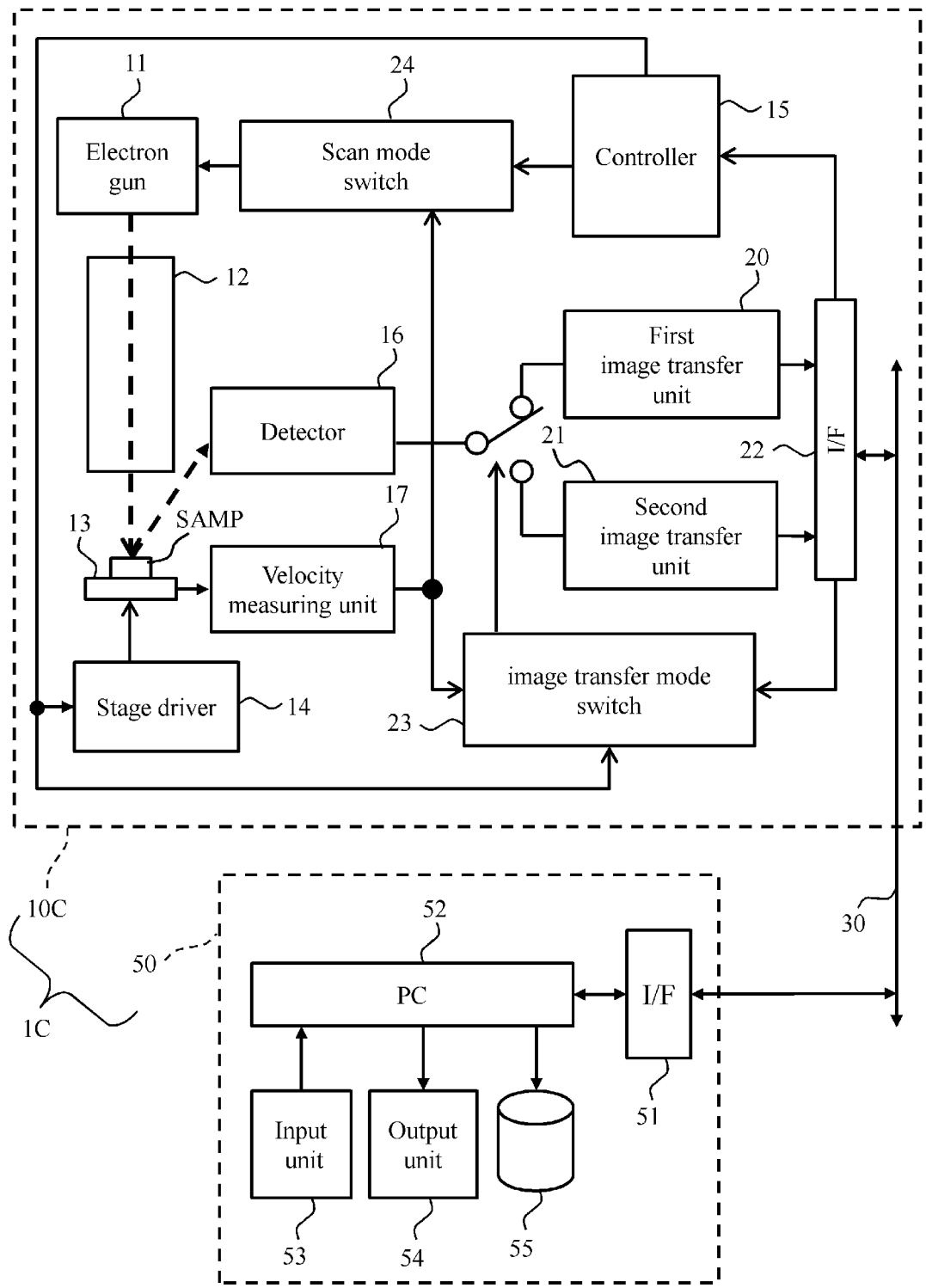

[Fig. 12]
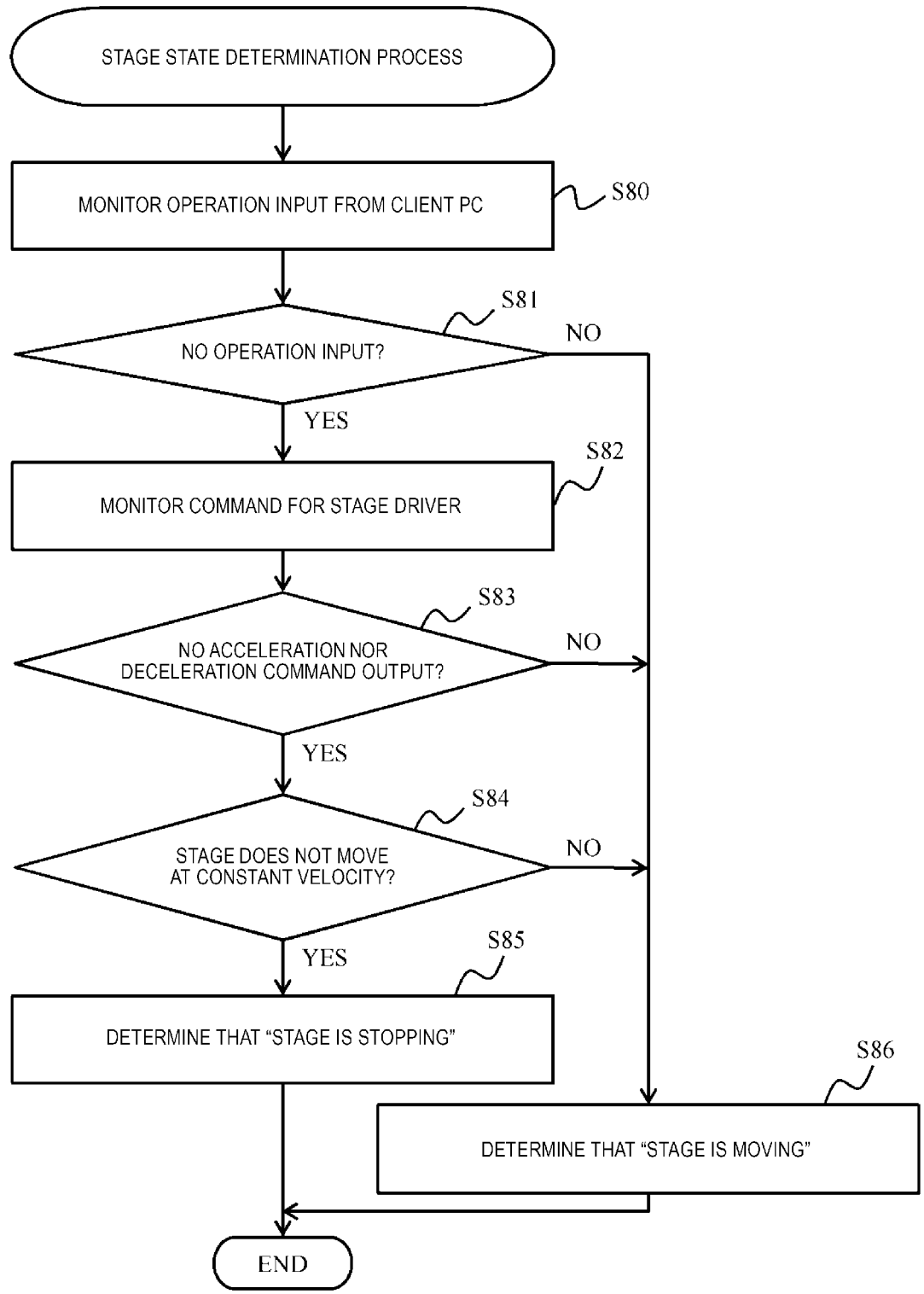

CHARGED PARTICLE BEAM DEVICE AND CONTROL METHOD OF CHARGED PARTICLE BEAM DEVICE

TECHNICAL FIELD

The invention relates to a charged particle beam device and a control method of a charged particle beam device.

BACKGROUND ART

A charged particle beam device such as a scanning electron microscope (SEM) that acquires a high-magnification image scans a sample with a focused electron beam, and detects secondary electrons emitted from the sample.

The detected secondary electrons are supplied as a video signal to a display synchronized with two-dimensional scanning using an electron beam. In a case where the charged particle beam device of the related art is used, since a state of a surface structure of the sample is able to be observed with high magnification, the charged particle beam device is used in a wide industrial field.

In a case where an image is observed by the charged particle beam device, a user initially transmits a command for operating a device main body to the device main body from a terminal such as a personal computer. The device main body of the charged particle beam device receives the command from the terminal. According to the content of the received command, the device main body detects an image (enlarged image) of the sample while moving the stage having the sample mounted thereon, changing a posture of the stage, or switching the scan modes in which the charged particle beam is irradiated from the electron beam source.

The device main body converts the enlarged image of the sample into image data such as a video signal, and transfers the image data to a terminal of the user from the device main body through a communication network line. The user displays the image on a terminal screen, and observes the displayed image.

A so-called Ethernet (registered trademark) line is used as the communication network line that connects the device main body and the terminal of the user. The Transmission Control Protocol (TCP) and the User Datagram Protocol (UDP) have been known as the communication protocol using Ethernet (registered trademark).

TCP is a transfer mode that prioritizes reliability rather than a communication speed. For example, even in a case where any failure occurs and packets are missing, a mechanism for increasing reliability is provided in TCP like a case where the missing packets are transferred again. In TCP, communication reliability is high, but a communication speed is relatively low since the overhead of a protocol process is large.

UDP is a transfer mode that prioritizes a communication speed rather than the communication reliability. For example, in a case where the packets are missing, the missing packets are not transferred again in UDP. Accordingly, since a protocol process is simple and the overhead thereof is small, it is possible to perform high-speed communication in UDP.

In PTL 1, the transfer modes are switched in the electron microscope in which a capacity of a communication network line is changed. Accordingly, it is possible to increase an update rate of the image in PTL 1 both in a case where the line capacity is large and in a case where the line capacity is small.

CITATION LIST

Patent Literature

PTL 1: JP-A-2004-171936

SUMMARY OF INVENTION

Technical Problem

The inventors of the present application have examined hard image transfer for improving the traceability of stage movement while increasing tolerance to communication failure, and have derived the following knowledge.

In the charged particle beam device that performs the image transfer using Ethernet (registered trademark), TCP having high reliability is generally used in order to increase the tolerance to communication failure. However, since the overhead of the protocol process is large, it is difficult to acquire a transfer speed required in transferring the enlarged image in TCP.

For example, in a case where the required transfer speed is not acquired, the display of the image on the terminal is not able to sufficiently trace the movement of the sample stage, and the reliability or usability of the charged particle beam device deteriorates. In a case where hardware appropriate for a higher-speed standard is used, it is possible to increase a transfer speed. However, since the hardware appropriate for the high-speed standard is expensive, the cost of the charged particle beam device increases.

In a case where UDP is used instead of TCP, it is possible to acquire a high transfer speed. However, since the tolerance to communication failure deteriorates, there is a concern that operability will deteriorate. For example, a case where a scan speed is set to be very low such that the sample is precisely investigated and one image is slowly scanned over a few minutes has been examined. In this case, in a case where any communication failure occurs in a state in which the image is displayed on the terminal of the user and some packets are missing, it is necessary to newly capture the sample again in order to acquire a complete image. The reason is that the missing packets are not re-transmitted in UDP and the image data included in the missing packets is not able to be displayed on the terminal screen.

An object of the present invention is to improve the traceability of the movement of the stage and tolerance to communication failure.

Solution to Problem

The present invention relates to switch between a plurality of image transfer units depending on a state of a stage and to use the switched image transfer unit. A charged particle beam device according to an aspect of the present invention includes an electron beam source that irradiates a sample on a stage with a charged particle beam; a stage driver that drives the stage; a detector that detects charged particles emitted from the sample; a first image transfer unit that transfers, as image data, a signal from the detector by using a first image transfer protocol; a second image transfer unit that transfers, as image data, a signal from the detector by using a second image transfer protocol; a switch unit that switches between the first image transfer unit and the second image transfer unit based on a state of the stage, and uses the switched image transfer unit; and a terminal that displays the image data received from any of the first image transfer unit and the second image transfer unit via a communication network.

The first image transfer protocol may be a protocol of which reliability is higher than reliability of the second image transfer protocol, and the switch unit selects the first image transfer unit in a case where it is determined that the state of the stage is a state in which the stage is stopping.

The second image transfer protocol may be a protocol of which a transfer speed is higher than a transfer speed of the first image transfer protocol, and the switch unit may select the second image transfer unit in a case where it is determined that the state of the stage is a state in which the stage is moving.

Advantageous Effects of Invention

According to the present invention, since the switching between the first image transfer unit and the second image transfer unit is performed based on the state of the stage and the switched image transfer unit is used, it is possible to transfer the image while utilizing the characteristics of the first image transfer protocol and the characteristics of the second image transfer protocol.

In a case where the first image transfer unit using the first image transfer protocol having high reliability is selected in a state in which the stage is stopping, it is possible to transfer a precise image having a low scan speed to the operation terminal with high reliability. In a case where the second image transfer unit using the second image transfer protocol having a high transfer speed is selected in a state in which the stage is moving, it is possible to transfer the image to the operation terminal while tracing the movement of the stage.

BRIEF DESCRIPTION OF DRAWINGS

FIG. 1 is a diagram showing the overall configuration of a charged particle beam device according to Embodiment 1.

FIG. 2 is a flowchart showing a stage state determination process.

FIG. 3 is a flowchart showing a process of switching between image transfer modes.

FIG. 4 is a flowchart showing a process of selecting a scan mode.

FIG. 5 is a flowchart of a stage state determination process in a charged particle beam device according to Embodiment 2.

FIG. 6 is a flowchart showing a process of switching between the image transfer modes in a charged particle beam device according to Embodiment 3.

FIG. 7 is a diagram showing the overall configuration of a charged particle beam device according to Embodiment 4.

FIG. 8 is a flowchart showing a stage state determination process.

FIG. 9 is a diagram showing the overall configuration of a charged particle beam device according to Embodiment 5.

FIG. 10 is a flowchart showing a stage state determination process.

FIG. 11 is a diagram showing the overall configuration of a charged particle beam device according to Embodiment 6.

FIG. 12 is a flowchart showing a stage state determination process.

DESCRIPTION OF EMBODIMENTS

Hereinafter, embodiments of the invention will be described with reference to the drawings. As will be described below, a charged particle beam device 1 according to the embodiment includes a first image transfer unit 20 that transfers an image by using an image transfer mode (for example, TCP) that prioritizes reliability and a second image transfer unit 21 that transfers an image by using an image transfer mode (for example, UDP) that prioritizes a speed. The charged particle beam device 1 includes a switch unit 23 that switches between the image transfer units 20 and 21 according to a predetermined condition set in advance.

The switch unit 23 determines a state of a stage 13, and selects any one of the first image transfer unit 20 and the second image transfer unit 21 based on the determination result. The switch unit 23 may switch between the image transfer units 20 and 21 in consideration of a scan control command or an update frequency (scan speed) of a scan mode.

According to the present embodiment having the aforementioned configuration, it is possible to increase tolerance to failure at the time of transferring the image by selecting the first image transfer unit 20, and it is possible to improve the traceability of the movement of the stage 13 by selecting the second image transfer unit 21. As a result, in the present embodiment, it is possible to improve reliability and usability with relatively low cost without using high-priced hardware.

Embodiment 1

Embodiment 1 will be described with reference to FIGS. 1 to 4. Initially, the overall configuration of the charged particle beam device 1 will be described with reference to FIG. 1.

For example, the charged particle beam device 1 includes a device main body 10 and a client personal computer 50, and the device main body 1 and the client personal computer 50 are connected via a communication network line 30 such as Ethernet (registered trademark).

The client personal computer 50 is a terminal that operates the device main body 10, and is an example of an "operation terminal". The client personal computer 50 may be disposed so as to be adjacent to the device main body 10 or may be disposed in a place distanced from the device main body 10. Hereinafter, the personal computer is abbreviated to "PC". Initially, the configuration of the client PC 50 will be described.

For example, the client PC 50 includes a communication interface 51, a PC main body 52, an information input unit 53, an information output unit 54, and an external storage device 55.

The communication interface 51 is a circuit for performing communication via the communication network line 30. For example, the PC main body 52 is a computer device that includes a microprocessor, a cache memory, a main storage, and an input and output interface.

The information input unit 53 is a device for giving an instruction to the device main body 10. For example, the information input unit 53 may be a keyboard, a touch panel, a mouse, a trackball, and a voice input device. The information output unit 54 is a device for outputting image data received from the device main body 10. For example, the information output unit 54 may be a display or a printer.

For example, the external storage device 55 is a device for storing image data captured in the device main body 10, and is hard disk drive or a flash memory device.

The configuration of the device main body 10 will be described. For example, the device main body 10 includes an electron gun 11, a mirror 12, the stage 13, a stage driver 14, a controller 15, a detector 16, a stage velocity measuring unit 17, the first image transfer unit 20, the second image transfer unit 21, a communication interface 22, the image transfer mode switch unit 23, and a scan mode switch unit 24.

The configuration shown in FIG. 1 includes devices implemented by hardware, and has functions implemented by software. For example, the electron gun 11, the mirror 12, the stage 13, the stage driver 14, the detector 16, and the stage velocity measuring unit 17 are implemented by hardware. In contrast, for example, the first image transfer unit 20, the second image transfer unit 21, the image transfer mode switch unit 23, and the scan mode switch unit 24 are functions implemented by software. The controller 15 and the communication interface 22 are implemented by the hardware in cooperation with the software. The aforementioned description is merely an example, and the devices implemented by hardware may be implemented by software, or the functions implemented by software may be implemented by hardware circuits.

The electron gun 11 is an example of an "electron beam source", and irradiates a sample SAMP mounted on the stage 13 with an electron beam as an example of a "charged particle beam". The mirror 12 controls an application direction or a focal point of the electron beam.

The stage 13 is a movable stage on which various samples are mounted. For example, the stage 13 may move in an X direction and a Y direction by a predetermined amount, and may be inclined with respect to an XY plane. The stage driver 14 is a device that controls the movement (including a posture change) of the stage 13.

The controller 15 is a device that controls the overall operation of the device main body 10. The controller 15 changes the scan mode or controls the movement of the stage 13 according to an instruction (command) from the client PC 50. For example, the controller 15 includes a microprocessor, a memory, an input and output circuit, and an auxiliary storage device (all not shown).

The detector 16 is a device that detects secondary electrons or reflection electrons emitted from the sample by irradiating the sample with the electron beam. The stage velocity measuring unit 17 is a device that measures a movement velocity of the stage 13. In these drawings, the stage velocity measuring unit 17 is abbreviated to a "velocity measuring unit 17".

The first image transfer unit 20 transfers image data by using TCP which is an example of a "first image transfer protocol". The first image transfer unit 20 transfers image data acquired from a detection signal of the detector 16 to the client PC 50 through the communication interface 22 and the communication network line 30. TCP is a connection type protocol.

The second image transfer unit 21 transfers image data by using UDP which is an example of a "second image transfer protocol". The second image transfer unit 21 transfers image data acquired from a detection signal of the detector 16 to the client PC 50 through the communication interface 22 and the communication network line 30. UDP is a connectionless type protocol.

In this example, in the connection type protocol, a communication path with a communication partner is established before communication starts, and a check response is received from the communication partner whenever data is transmitted to the communication partner. Accordingly, TCP which is the connection type protocol has reliability higher than that of UDP which is the connectionless type protocol.

In contrast, in the connectionless type protocol, a communication path with a communication partner is not established before communication starts, and data is unilaterally transmitted to the communication partner. In the connectionless type protocol, a check response from the communication partner is not received. Accordingly, as compared with TCP which is the connection type protocol, it is possible to reduce the overhead and thus, it is possible to increase a communication speed in UDP which is the connectionless type protocol.

It is preferable that image data of which a data amount per communication is large, such as image data having a high magnification or image data having a low scan speed, is transmitted by using TCP. Even in a case where some packets are lost due to any failure, only the lost packets (missing packets) are able to be re-transmitted in TCP. In contrast, in a case where the image data of which the data amount per communication is large is transmitted by using UDP and some packets are lost due to communication failure, it is necessary to re-transmit the whole data. The lost packets are not able to be re-transmitted in UDP. Accordingly, UDP is appropriate in transmitting image data of which a data amount per communication is relatively small in a short time.

The communication interface 22 is a circuit that performs communication via the communication network line 30. The image transfer mode switch unit 23 which is an example of the "switch unit" selects any one of the first image transfer unit 20 and the second image transfer unit 21 based on the state of the stage 13. In the following description, the image transfer mode switch unit 23 may also be referred to as the switch unit 23. A case where the switching between the first image transfer unit 20 and the second image transfer unit 21 is performed may be expressed as a case where the image transfer unit is selected.

For example, although a selection criterion will be described below, the switch unit 23 selects the first image transfer unit 20 in a case where high-reliability communication is required, and selects the second image transfer unit 21 in a case where high-speed communication is required.

The scan mode switch unit 24 selects a scan mode to be used in reality from a scan mode output from the controller 15 and a stage velocity measured in the stage velocity measuring unit 17. An example of the method of selecting the scan mode will be described below.

FIG. 2 is a flowchart showing a stage state determination process. For example, the present process is performed by the switch unit 23 on a regular basis or on a predetermined occasion.

The switch unit 23 acquires the stage velocity from the stage velocity measuring unit 17 (S10). The stage velocity is a velocity of the stage 13 of which the position or the posture is changed by the stage driver 14.

The switch unit 23 determines whether or not the stage velocity is zero (S11). In a case where it is determined that the stage velocity is zero (S11: YES), the switch unit 23 determines that the state of the stage 13 is a state in which "stage is stopping" (S12). In contrast, in a case where it is determined that the stage velocity is not zero (S11: NO), the switch unit 23 determines that the state of the stage 13 is a state in which "stage is moving" (S13).

As will be described below, the selection of the image transfer unit or the switching between the scan modes is performed depending on the determination result of the stage state. For example, in order to restrain the selection or the switching from being frequently performed, the determination result may not be changed in a predetermined case. For example, after the state is switched from the state in which the "stage is moving" to the state in which the "stage is stopping", even in a case where the stage velocity is not zero, the state is not returned to the state in which the "stage is moving" until a stage driving command is input from the client PC 50.

The present embodiment is not limited to a case where it is determined that the "stage is stopping" in a case where the stage velocity detected by the stage velocity measuring unit 17 is zero. It may be determined that the "stage is stopping" in a case where the stage velocity is lowered to a threshold for stopping, in order to determine that the "stage is stopping" at earlier timing, taking into consideration a time required to perform the switching between the image transfer units 20 and 21 or the scan modes. Accordingly, it is possible to end the switching between the image transfer units or the scan modes before the stage 13 stops in reality or almost simultaneously when the stage stops. Accordingly, it is possible to continue to capture the sample relatively smoothly, and the usability of the charged particle beam device 1 is improved.

In this example, the threshold for stopping is a reference value prepared in order to determine that the stage 13 stops. For example, a value which is about 10% of the highest movement velocity of the moving stage 13 driven by the stage driver 14 may be set as the threshold for stopping. 10% is an example, and is not limited to thereto. In a case where a time from when it is determined that the "stage is stopping" to when the stage 13 is stopped in reality is approximately equal to a time from when it is determined that the "stage is stopping" to when the switching between the image transfer units 20 and 21 or the scan modes is ended, it is possible to eliminate awaiting time from when the stage state is determined to when the switching between the image transfer units or the scan modes is ended. The usability of the charged particle beam device used by a user is improved by simply reducing the waiting time even though the waiting time is not completely canceled.

FIG. 3 is a flowchart showing a process of switching between the image transfer units 20 and 21. The present process is performed by the switch unit 23 on a regular basis or on a predetermined occasion.

The switch unit 23 acquires the determination result of the stage state determination process described in FIG. 2 (S20), and determines whether or not the state of the stage 13 is the state in which the "stage is stopping" (S21). In a case where the determination result of the stage state is the state in which the "stage is stopping" (S21: YES), the switch unit 23 selects the first image transfer unit 20 (S22). In contrast, in a case where the determination result of the stage state is not the state in which the "stage is stopping" (S21: NO), that is, in a case where the "stage is moving", the switch unit 23 selects the second image transfer unit 21 (S23).

FIG. 4 is a flowchart showing a process of selecting the scan mode. The present process is performed by the scan mode switch unit 24 on a regular basis or on a predetermined occasion. As shown in FIG. 1, the scan mode switch unit 24 receives the inputs from the controller 15 and the stage velocity measuring unit 17, determines the scan mode, and transmits the determined scan mode to the electron gun 11. The electron gun 11 irradiates the sample with the electron beam according to the received scan mode.

The scan mode switch unit 24 acquires the determination result of the stage state determination process (S30), and determines whether or not the state of the stage 13 is the state in which the "stage is stopping" (S31).

In a case where the determination result of the stage state is the state in which the "stage is stopping" (S31: YES), the scan mode switch unit 24 selects the scan mode output from the controller 15 (S32). In contrast, in a case where the determination result of the stage state is not the state in which the "stage is stopping" (S31: NO), that is, in a case where the stage 13 is moving, the scan mode switch unit 24 selects a scan mode for moving the stage which is prepared in advance (S33).

The scan mode for moving the stage is an appropriate scan mode which allows the user to search for an observing target location of the sample while moving the stage 13 through the client PC 50. It is preferable that the scan mode for moving the stage is a mode in which images to be displayed on a display are updated at predetermined values at which the images are seen as a moving image by the eyes of an observer (user). That is, the scan mode for moving the stage is a mode in which images are able to be updated relatively smoothly such that the user can find the observing target location in a short time.

In a case where a precise image is generated by lowering the scan speed, since a time taken to generate one image becomes long, it takes a long time for the user to find the observing target location of the sample. In the present embodiment, in a case where the stage 13 is moving, the user selects the scan mode for moving the stage irrespective of the output from the controller 15, and easily finds the observing target location.

In a case where the stage 13 is moving and the scan speed is lowered, since the stage 13 moves before the generation of the image is completed, the image is not able to be completed. The user needs to find the observing target location while seeing an incomplete image, and thus, the usability deteriorates. In the present embodiment, the scan mode for moving the stage is prepared, and the output from the controller 15 is ignored in a case where the stage 13 is moving, and the scan mode for moving the stage is selected.

In the present embodiment having the aforementioned configuration, since the image transfer unit 20 or 21 appropriate for the state (stopping/moving) of the stage 13 is selected, it is possible to improve both the reliability and the traceability of the stage movement.

In the present embodiment, the image transfer unit 20 or 21 is selected and the scan mode is also switched depending on the state of the stage 13. In the present embodiment, in a case where the stage is moving, the scan mode for moving the stage is selected (S33) and the second image transfer unit 21 is also selected such that the images are updated while tracing the movement of the stage 13. In the scan mode for moving the stage, since the scan speed is high, a high transfer speed is required to transfer an image acquired in the scan mode for moving the stage to the client PC 50. It is necessary to transmit image data to the client PC 50 from the device main body 10 in a short time.

Meanwhile, the reliability is not much required in a case where the image acquired in the scan mode for moving the stage is transferred. That is, in a case where image data acquired in the scan mode for moving the stage is transferred, even though some packets are missing, there is little necessity to re-transmit the missing packets. The reason is that the next image data is immediately sent to the client PC 50 even though the image is not completed due to some missing packets.

Since the images are overwritten with the latest image one after another on the display of the client PC 50, there is little necessity to re-transmit the missing packets. Accordingly, in the present embodiment, in a case where the stage is moving, the communication speed (the traceability of the stage movement) is prioritized than the reliability (image quality) of the communication.

Meanwhile, in a case where the stage 13 is stopping, there is a high possibility that the user will observe the observing target location while taking their time. In other words, in a case where the user finds the observing target location, the user stops the stage 13, and displays a precise image on the display of the client PC 50. The user tries to acquire a precise image of the observing target location by lowering the scan speed (by lowering a frame update rate).

In this case, a large data amount of image data items are sent to the client PC 50 from the device main body 10 via the communication network line 30. In a case where some packets of the large amount of image data items are missing, since an image of an area corresponding to the missing packets is missing, there is a concern that the user will not be able to sufficiently observe the observing target location. In the communication protocol that does not have the function of re-transmitting the missing packets, it is necessary to transmit all the large amount of image data items from the device main body 10 to the client PC 50 once again, and the usability deteriorates.

In the present embodiment, in a case where the stage 13 is stopping, the image transfer unit 20 that prioritizes the reliability of the communication is selected. Accordingly, even in a case where some packets are missing during precise observation, since only the missing packets are re-transmitted from the device main body 10 to the client PC 50, the usability of the charged particle beam device by the user is improved.

Embodiment 2

Embodiment 2 will be described with reference to FIG. 5. The following embodiments including the present embodiment correspond to modification examples of the first embodiment. A difference from Embodiment 1 will be mainly described.

Although it has been described in Embodiment 1 that it is determined whether or not the state of the stage 13 is the state in which the stage is stopping (whether the stage is stopping or the stage is moving) based on the stage velocity detected by the stage velocity measuring unit 17. In contrast, in the present embodiment, the state of the stage 13 is determined based on a stage driving command output from any of the controller 15 and the client PC.

FIG. 5 is a flowchart showing a stage state determination process according to the present embodiment. In the present embodiment, the switch unit 23 may detect the stage driving command output to the stage driver 14 from the controller 15 or the stage driving command output to the stage driver 14 from the client PC 50 through the communication interface 22.

The switch unit 23 according to the present embodiment performs the process of FIG. 5 on a regular basis or on a predetermined occasion. The switch unit 23 acquires the stage velocity based on the detected stage driving command (S40). For example, in a case where the stage driving command indicates some movement, it may be determined that the stage 13 is moving. Accordingly, step S40 may restate that "it is detected whether or not the stage is moving based on the stage driving command".

The switch unit 23 determines whether or not the stage velocity is zero (S41). Similarly to the process described in FIG. 2, in a case where it is determined that the stage velocity is zero (S41: YES), the switch unit 23 determines that the state of the stage 13 is the state in which the "stage is stopping" (S42). In a case where it is determined that the stage velocity is not zero (S41: NO), the switch unit 23 determines that the state of the stage 13 is the state of the "stage is moving" (S13).

The present embodiment having such a configuration also demonstrates the same operational effects as those of Embodiment 1. In the present embodiment, since the state of the stage 13 is estimated based on the stage driving command issued from any of the controller 15 and the client PC 50, it is not necessary to receive the stage velocity detected by the stage velocity measuring unit 17. Accordingly, the stage velocity measuring unit 17 is not necessary for only a mechanism for determining the stage state.

Embodiment 3

Embodiment 3 will be described with reference to FIG. 6. In the present embodiment, the image transfer unit is switched based on the determination result of the stage state, the scan speed, and an operation command from the client PC 50. The switch unit 23 performs the process shown in FIG. 6 on a regular basis or on a predetermined occasion.

The switch unit 23 acquires the determination result of the stage state determination process (S50), and determines whether or not the state of the stage 13 is the state in which "stage is stopping" (S51). In a case where the determination result of the stage state is the state in which the "stage is stopping" (S51: YES), the switch unit 23 determines whether or not the scan speed required in the scan mode output from the controller 15 is equal to or greater than a predetermined value (S52). In a case where the scan speed required by the controller 15 is less than the predetermined value (S52: NO), the switch unit 23 selects the first image transfer unit 20 (S53).

In contrast, even in a case where the stage 13 is stopping (S51: YES), the switch unit 23 selects the second image transfer unit 21 (S54) in a case where the scan speed required by the controller 15 is equal to or greater than the predetermined value (S52: YES). In a case where the determination result of the stage state is not the state in which the "stage is stopping" (S51: NO), that is, in a case where the "stage is moving", the switch unit 23 also selects the second image transfer unit 21 similarly to the description of Embodiment (S54).

In a case where the second image transfer unit 21 is selected, the switch unit 23 determines whether or not an instruction to stop the scanning is received from the client PC 50 (S55). In a case where the instruction to stop the scanning is not received (S55: NO), the present process is ended. After a predetermined time elapses or in a case where a predetermined occasion occurs, the switch unit 23 performs the present process again.

In a case where the second image transfer unit 21 is selected and it is detected that the instruction to stop the scanning is received from the client PC 50 (S55: YES), the flow proceeds to step S53, and the switch unit 23 switches from the second image transfer unit 21 to the first image transfer unit 20.

In this example, the reason why step S52 branches off will be described. In a case where the scan speed instructed by the controller 15 is equal to or greater than the predetermined value, that is, in a case where the frame update rate is equal to or greater than the predetermined value, a required transfer speed is not able to be acquired by just using the first image transfer unit 20. In other words, the predetermined value in step S52 is a value at which it is possible to determine that a required communication speed is not acquired by just using the first image transfer unit 20. In this case (S52: YES), the second image transfer unit 21 is selected in order to secure a communication speed matching the scan speed (S54).

The reason why the switching from the second image transfer unit 21 to the first image transfer unit 20 is performed in a case where the scanning is stopped will be described. In a case where the operation command from the client PC 50 is a scan stop command (S55: YES), the first image transfer unit 20 having a packet re-transmission function is selected such that the last image transfer before the scanning is stopped succeeds. In a case where some packets are missing at the time of transferring the last image data before the scanning is stopped, since a complete image is not able to be displayed on the display of the client PC 50, there is a concern that the user will not be able to sufficiently observe the sample. The switch unit 23 selects the first image transfer unit 20 that is capable of re-transmitting only the missing packets and is capable of transferring the image to the client PC 50 from the device main body 10 with high reliability.

The present embodiment having such a configuration also demonstrates the same operational effects as those of Embodiment 1. In the present embodiment, in a case where the scan speed is equal to or greater than the predetermined value even though the stage 13 is stopping, since the second image transfer unit 21 is selected, it is possible to display the image on the display according to the update frequency of the image.

In the present embodiment, even in a case where the second image transfer unit 21 is used, the last image at the time of stopping the scanning is transmitted to the client PC by using the first image transfer unit 20 having high reliability. Accordingly, in the present embodiment, it is possible to cope with a high frame update rate while maintaining the reliability of the image transfer, and the usability is improved.

Embodiment 4

Embodiment 4 will be described with reference to FIGS. 7 and 8. In the present embodiment, the switch unit 23 determines the stage state based on the stage driving command input to the stage driver 14 from the controller 15. It has been described in Embodiment 2 that the stage state is determined based on the stage driving command issued from any of the controller 15 and the client PC 50. In contrast, in the present embodiment, the state of the stage 13 is determined based on a stage acceleration command or deceleration command output from the controller 15 and a motion state of the stage 13 at a constant velocity.

FIG. 7 shows the overall configuration of a charged particle beam device 1A according to the present embodiment. A difference between the configuration of FIG. 7 and the configuration of FIG. 1 is that the stage driving command input to the stage driver 14 from the controller 15 is also input to the switch unit 23 in the present embodiment shown in FIG. 7. In the present embodiment shown in FIG. 7, the stage velocity measuring unit 17 described in FIG. 1 is removed.

FIG. 8 is a flowchart showing a stage state determination process according to the present embodiment. The present process is performed by the switch unit 23 on a regular basis or on a predetermined occasion. The switch unit 23 monitors the stage driving command input to the stage driver 14 from the controller 15 (S60), and determines whether or not neither the acceleration command nor the deceleration command is output from the controller 15 (S61). In a case where it is determined that no acceleration command nor the deceleration command is output from the controller 15 (S61: YES), the switch unit 23 determines whether or not the stage 13 does not move at the constant velocity (S62). The switch unit 23 may estimate whether or not the stage 13 moves at the constant velocity based on the output timing and the kind of the stage driving command output from the controller 15.

In a case where it is determined that the stage 13 does not move at the constant velocity (S62: YES), the switch unit 23 determines that the state of the stage 13 is the state in which the "stage is stopping" (S63). In a case where any of the acceleration command and the deceleration command is input to the stage driver 14 from the controller 15 (S61: NO) or in a case where the stage 13 moves at the constant velocity (S62: NO), the switch unit 23 determines that the state of the stage 13 is the state in which the "stage is moving" (S64). The present embodiment having such a configuration also demonstrates the same operational effects as those of Embodiment 1.

Embodiment 5

Embodiment 5 will be described with reference to FIGS. 9 and 10. In a charged particle beam device 1B according to the present embodiment, the stage state is determined based on the stage driving command input from the client PC 50. It has been described in Embodiment 2 that the stage state is determined based on the stage driving command issued from any of the controller 15 and the client PC 50. It has been described in Embodiment 4 that the state of the stage 13 is determined based on the stage acceleration command or deceleration command output from the controller 15 and the motion state of the stage 13 at the constant velocity. It will be described in the present embodiment that the state of the stage 13 is determined based on the operation command from the client PC 50.

FIG. 9 shows the overall configuration of the charged particle beam device 1B according to the present embodiment. In the present embodiment, the switch unit 23 is connected to the communication interface 22. The switch unit 23 may monitor a command input to the controller 15 from the client PC 50 through the communication interface 22.

FIG. 10 is a flowchart showing a stage state determination process according to the present embodiment. The switch unit 23 monitors the operation command (referred to as an operation input) input to the device main body 10 from the client PC 50 through the communication interface 22 (S70). The operation command is a command for instructing that the stage 13 is to move, and is the stage driving command.

The switch unit 23 determines whether or not the operation command is not input from the client PC 50 (S71). In a case where the operation command is not input (S71: YES), the switch unit 23 determines that the state of the stage 13 is the state in which the "stage is stopping" (S72). In a case where the operation command is input from the client PC 50 (S71: NO), the switch unit 23 determines that the state of the stage 13 is the state in which the "stage is moving".

The present embodiment having such a configuration also demonstrates the same operational effects as those of Embodiment 1. In the present embodiment, since the stage state is determined based on the operation command input from the client PC 50, it is possible to determine the state of the stage 13 earlier than in a case where the stage state is determined based on an actual movement velocity of the stage 13. Accordingly, it is possible to early instruct that the switching between the image transfer units 20 and 21 is to be performed, and it is possible to improve the usability by reducing the waiting time until the switching is completed.

Embodiment 6

Embodiment 6 will be described with reference to FIGS. 11 and 12. The present embodiment is the combination of Embodiment 4 and Embodiment 5. That is, in a charged particle beam device 1C according to the present embodiment, the state of the stage 13 is determined based on both the stage driving command output from the controller 15 and the operation command (the stage driving command from the client PC) input from the client PC 50.

FIG. 12 is a flowchart showing a stage state determination process according to the present embodiment. The present process is performed by the switch unit 23 on a regular basis or on a predetermined occasion.

The switch unit 23 monitors the operation command input to the device main body 10 from the client PC 50 (S80). The switch unit 23 determines whether or not the operation command is not input from the client PC 50 (S81).

In a case where the operation command is not input (S81: YES), the switch unit 23 monitors the stage driving command input to the stage driver 14 from the controller 15 (S82), and determines whether or not neither the acceleration command nor the deceleration command is output from the controller 15 (S83).

In a case where it is determined that no acceleration command nor the deceleration command is output from the controller 15 (S83: YES), the switch unit 23 determines whether or not the stage 13 does not move at the constant velocity (S84). In a case where it is determined that the stage 13 does not move at the constant velocity (S84: YES), the switch unit 23 determines that the state of the stage 13 is the state in which the "stage is stopping" (S85).

In any of a case where the operation command is input from the client PC 50 (S81: NO), a case where any of the acceleration command and the deceleration command is input to the stage driver 14 from the controller 15 (S83: NO), and a case where the stage 13 moves at the constant velocity (S84: NO), the switch unit 23 determines that the state of the stage 13 is the state in which the "stage is moving" (S86). The present embodiment having such a configuration also demonstrates the same operational effects as those of Embodiment 1, Embodiment 4, and Embodiment 5.

The present invention is not limited to the above-described embodiments. It should be appreciated by those skilled in the art that the above-described embodiments may be added or changed in various from without departing from the scope of the present invention. For example, the charged particle beam device is not limited to the scanning electron microscope (SEM), and another device may be used.

REFERENCE SIGNS LIST 1, 1A, 1B, 1C: charged particle beam device
10: device main body
11: electron gun
12: mirror
13: stage
14: stage driver
15: controller
16: detector
17: stage velocity measuring unit
20: first image transfer unit
21: second image transfer unit
22: communication interface
23: image transfer mode switch unit
24: scan mode switch unit
30: communication network line
50: client PC

The invention claimed is:

1. A charged particle beam device comprising:
an electron beam source that irradiates a sample on a stage with a charged particle beam;
a stage driver that drives the stage;
a detector that detects charged particles emitted from the sample and generates a signal based on the charged particles detected;
a first image transfer unit that utilizes a first image transfer protocol to transfer image data via a communication network;
a second image transfer unit that utilizes a second image transfer protocol to transfer image data via the network, wherein the second image transfer protocol is a protocol in which a transfer speed is higher than a transfer speed of the first image transfer protocol;
a switch unit that:
determines a velocity of the stage,
on condition that the velocity is less than a threshold, selects the first image transfer unit as a selected communication unit,
on a condition that the velocity is not less than the threshold, selects the second image transfer unit as the selected communication unit, and
communicatively couples the detector to the network via the selected communication unit, wherein the selected communication unit generates the image data based on the signal from the detector; and
a terminal that displays the image data received via the communication network.

2. The charged particle beam device according to claim 1, wherein the first image transfer protocol is a protocol of which reliability is higher than reliability of the second image transfer protocol.

3. The charged particle beam device according to claim 1, wherein the switch unit further selects the second image transfer unit when a scan speed of a scan mode is equal to or greater than a predetermined value.

4. The charged particle beam device according to claim 3, wherein the switch unit switches from the second image transfer unit to the first image transfer unit in a case where an instruction to stop scanning is received in a state in which the second image transfer unit is selected.

5. The charged particle beam device according to claim 1, wherein the threshold is a percentage of a maximum velocity of the stage.

6. The charged particle beam device according to claim 1, wherein:
the condition that the velocity is less than the threshold indicates that the stage is stopping,
the charged particle beam device operates in a scan mode selected by the terminal in a case where the stage is stopping, and
the charged particle beam device operates in a predetermined scan mode prepared in advance in a case where the stage is moving.

7. The charged particle beam device according to claim 6, wherein the predetermined scan mode is a mode in which images to be displayed on the terminal are updated at intervals at which the images are seen as a moving image by an observer.

8. The charged particle beam device according to claim 1, wherein the first image transfer protocol is a connection type protocol.

9. The charged particle beam device according to claim 1, wherein the second image transfer protocol is a connectionless type protocol.

10. A control method of a charged particle beam device that irradiates a sample on a stage with a charged particle beam, detects charged particles emitted from the sample, and displays an image, the method comprising:

determining a velocity of the stage;
on condition that the velocity is less than a threshold, selecting a first image transfer unit that that utilizes a first image transfer protocol to transfer image data as a selected communication unit,
on a condition that the velocity is not less than the threshold, selects a second image transfer unit that utilizes a second image transfer protocol to transfer image data as the selected communication unit, wherein the second image transfer protocol is a protocol in which a transfer speed is higher than a transfer speed of the first image transfer protocol;
and
transferring, using the selected communication unit, image data output from a detector to a terminal via a communication network.

11. The control method of the charged particle beam device according to claim 10,
wherein the first image transfer protocol is a protocol in which reliability is higher than reliability of the second image transfer protocol.

12. The control method of the charged particle beam device according to claim 10,
wherein the second image transfer unit is further selected when an update frequency of a scan mode is equal to or greater than a predetermined value.

* * * * *